United States Patent
Zheng (10) Patent No.: US 7,677,299 B2
(45) Date of Patent: Mar. 16, 2010

(54) NEARLY ISOTHERMAL HEAT PIPE HEAT SINK

(76) Inventor: Wen-Chun Zheng, 551 Crystalberry Ter., San Jose, CA (US) 95129

( * ) Notice: Subject to any disclaimer, the term of this patent is extended or adjusted under 35 U.S.C. 154(b) by 914 days.

(21) Appl. No.: 11/150,024

(22) Filed: Jun. 10, 2005

(65) Prior Publication Data

US 2006/0096740 A1 May 11, 2006

Related U.S. Application Data

(60) Provisional application No. 60/522,825, filed on Nov. 10, 2004.

(51) Int. Cl.
 *F28D 15/00* (2006.01)
(52) U.S. Cl. .............................. 165/104.26; 165/104.33
(58) Field of Classification Search .............. 165/80.3, 165/104.21, 104.33, 170
See application file for complete search history.

(56) References Cited

U.S. PATENT DOCUMENTS

| | | | |
|---|---|---|---|
| 4,046,190 A | | 9/1977 | Marcus et al. |
| 4,989,319 A | | 2/1991 | Kapolnek et al. |
| 5,195,577 A | * | 3/1993 | Kameda et al. ......... 165/104.13 |
| 5,390,733 A | * | 2/1995 | Young ......................... 165/173 |
| 5,694,295 A | * | 12/1997 | Mochizuki et al. .......... 361/699 |
| 5,813,592 A | | 9/1998 | Midling et al. |
| 6,056,044 A | | 5/2000 | Benson et al. |
| 6,082,443 A | | 7/2000 | Yamamoto et al. |
| 6,263,959 B1 | | 7/2001 | Ikeda et al. |
| 6,301,109 B1 | | 10/2001 | Chu et al. |
| 6,317,322 B1 | | 11/2001 | Ueki et al. |
| 6,321,831 B1 | * | 11/2001 | Tanaka et al. ........... 165/104.33 |
| 6,490,160 B2 | | 12/2002 | Dibene, II et al. |
| 6,550,531 B1 | * | 4/2003 | Searls et al. ............ 165/104.33 |
| 6,626,233 B1 | * | 9/2003 | Connors ..................... 165/80.3 |
| 6,650,544 B1 | * | 11/2003 | Lai ............................. 361/700 |

(Continued)

FOREIGN PATENT DOCUMENTS

JP 10144831 A * 5/1998

(Continued)

OTHER PUBLICATIONS

"Heat Sink with Heat Pipe", JP 410144831A, May 29, 1998, JPO Abstract.*

(Continued)

*Primary Examiner*—Ljiljana (Lil) V Ciric
(74) *Attorney, Agent, or Firm*—Patent Law Group LLP; David C. Hsia (57) ABSTRACT

A nearly isothermal heat pipe heat sink is provided. The heat sink includes a flat heat pipe connected to one or more flat vapor chambers using a conduit and a heat pipe. The connected flat heat pipe and the flat vapor chambers form a common vapor domain. Fins are attached on the outer surfaces of the flat heat pipe and the flat vapor chambers. Various capillary structures are also provided for fabricating flat heat pipes. A panelized welding process is further provided for fabricating flat heat pipes or flat vapor chambers. The panelized welding process uses either friction stir welding (FSW) or plasma beam welding to transversely join the panels that form the flat heat pipes or the flat vapor chambers.

10 Claims, 8 Drawing Sheets

U.S. PATENT DOCUMENTS

| | | |
|---|---|---|
| 6,665,187 B1 | 12/2003 | Alcoe et al. |
| 6,742,575 B2 * | 6/2004 | Suzuki ................... 165/104.21 |
| 6,749,013 B2 | 6/2004 | Ikeda et al. |
| 6,827,132 B1 * | 12/2004 | Lin ........................ 165/104.21 |
| 6,827,136 B2 * | 12/2004 | Liu ........................ 165/104.33 |
| 6,863,118 B1 | 3/2005 | Wang et al. |
| 6,966,361 B2 * | 11/2005 | Connors ................ 165/104.33 |
| 6,989,991 B2 * | 1/2006 | Barson et al. ................ 361/699 |
| 2002/0029873 A1 * | 3/2002 | Sugito et al. ................ 165/166 |
| 2002/0080584 A1 * | 6/2002 | Prasher et al. .............. 361/702 |

FOREIGN PATENT DOCUMENTS

JP          10238973 A  *  9/1998

OTHER PUBLICATIONS

"Mega Flats," PSC Computer Products brochure.

"What is a Heat Pipe?." article downloaded on Apr. 30, 2005 from http://www.cheresources.com/htpipes.shtml, pp. 1-14.

"Support the Thermal Solution, Fujikura Heat Pipe & Heat Sink," Fujikura Theraml Technology Global Support literature, pp. 1-10.

* cited by examiner

NEARLY ISOTHERMAL HEAT PIPE HEAT SINK

CROSS-REFERENCE TO RELATED APPLICATIONS

This application claims the benefit of U.S. Provisional Application No. 60/522,825, filed Nov. 10, 2004, and incorporated herein by this reference.

FIELD OF INVENTION

This invention relates to the thermal management of computer and electronic systems in the computer, telecommunication, electronic appliance, game machine, aerospace, and automotive industries, and more specifically this invention relates to heat pipe heat sinks.

DESCRIPTION OF RELATED ART

A heat pipe is a highly efficient heat transfer device that typically includes a vacuum vessel. The vacuum vessel has a capillary/wick structure on its inner wall and contains a small quantity of working fluid. When a heat source is applied to an evaporator section, the working fluid evaporates and the vapor spreads quickly in the vessel. The vapor carries latent heat to a condenser section and condenses to liquid as the latent heat dissipates to outside of the heat pipe by conduction or convection. The working fluid is transported by the capillary structure back to the evaporator section, thereby completing a two phase heat transfer cycle without consuming any power.

Generally, heat pipes are made from highly thermally conductive metals such as stainless steel, copper, and aluminum. Working fluids that are compatible with these heat pipe materials include water, mercury, and other chemicals depending on the working temperature range. Copper and pure water are the most common combination for the heat pipes used in computer and electronic systems. To overcome gravity so that evaporator and condenser can be in any orientation, the capillary structure in a heat pipe provides the pumping mechanism that transports the working fluid back to the evaporator section. Typical capillary structures include sintered metal powder, grooves, and fibers.

Rather than having a round or oblong tube shape of a typical heat pipe, a flat heat pipe has a plate shape and is usually made of metal sheets or plates. The flat heat pipe has a vapor chamber enclosing a working fluid. The vapor chamber has capillary structures on the inner surfaces of the top and bottom plates. The evaporator portion is one or more small areas on the outer surface of either the top or bottom plate that contact one or more heat sources (e.g., an electronic device). All other areas of the top and bottom plates serve as the condenser portion.

The working principle of the flat heat pipe is similar to that of a typical heat pipe mentioned earlier. When a flat heat pipe is used as a base of a heat sink, a pedestal on the bottom plate absorbs heat from an electronic device and the working fluid evaporates so that vapor spreads and fills the vapor chamber very quickly. This mechanism enables the flat heat pipe to reach and maintain substantially the same temperature anywhere on its exterior surface. The heat is then uniformly transferred to fins connected to the flat heat pipe. Through natural or forced convection over the surfaces of the fins, the vapor condenses to liquid and the liquid is pumped back to the evaporator portion after releasing the latent heat. Clearly a heat sink with a flat heat pipe base is more efficient and lighter than a solid metal base of the same size.

The fabrication of a flat heat pipe heat sink requires three core technologies. The first technology is the formation of a flat heat pipe using metal sheets or plates with a capillary/wick structure. The second technology is the welding process used to form the hermetic flat heat pipe. The third technology is the design of heat sinks with flat heat pipes. Summaries of references related to these technologies are provided hereafter.

U.S. Pat. No. 6,056,044 discloses a heat pipe with an improved wick structure. The wick structure consists of a substrate and projections on the substrate. The projections take the shape of a mushroom with a stalk portion attached to the substrate. The projections are oriented in non-parallel configuration to provide multiple flow channels between them across the substrate.

U.S. Pat. No. 4,989,319 discloses a method to provide capillary grooves of variable cross-sectional dimension along the length of a heat pipe. The method includes forming capillary grooves of generally constant cross-sectional dimension on the interior surface of the heat pipe and then exposing different portions of the capillary grooves to a chemical etching for different lengths of time to create capillary grooves of varying cross-sectional dimension.

U.S. Pat. No. 4,046,190 discloses a flat-pipe heat pipe formed by enclosing a metal wicking between two capillary grooved flat panels. The capillary grooves in one plate are at a right angle to the grooves in the opposing plate so the working fluid can flow in all directions. The metal wicking intersects every groove on the surface of both plates to provide fluid flow from plate to plate and a vapor path to all portions of the plate.

U.S. Pat. No. 6,665,187 discloses an electronic package having a substrate, a lid with a vapor chamber attached to the substrate, and a thermal transfer medium between the lid and components mounted on the substrate. The substrate and the lid have matching thermal expansion coefficients. The lower wall of the lid has protruding regions maintaining contact with the thermal transfer medium on the components.

U.S. Pat. No. 6,490,160 discloses a heat transfer device with a thermally conductive chamber. The thermally conductive chamber has a first thermally conductive chamber portion with a base mounted to a heat dissipating device, and a second thermally conductive chamber portion with tapered hollow pins extending from the first thermally conductive chamber portion.

U.S. Pat. No. 6,550,531 discloses a heat dissipation device with a base portion having a vapor chamber with an upper surface sloped from a central apex to edges of the base portion, and fins extending from the base portion. The vapor chamber includes at least one extension on the vapor chamber upper surface adopted to direct a condensed working fluid toward a desired location on a vapor chamber lower surface. The vapor chamber lower surface has at least one depression to collect the working fluid in at least one desired location.

U.S. Pat. No. 6,626,233 discloses a bi-level assembly including a heat sink, a processor, and a power supply. The heat sink includes a base and at least one fin structure attached to the base. The base may be a plate attached with heat pipes or the base may be a vapor chamber. The base has an s-bend so it can be mounted on top of the processor and power supply with different heights.

U.S. Patent Application Publication No. US 2002/0080584 discloses an integrated heat sink and spreader has a vapor chamber heat sink with a thinner top wall and a thicker bottom wall. The thicker bottom wall is mounted on the item to be cooled and fins are attached on the thinner top wall.

U.S. Pat. No. 6,863,118 discloses a heat pipe with a top plate and a bottom plate. Each plate has low fins and high fins so that the high fins on one plate are received in grooves between the low fins on the other plate.

U.S. Pat. No. 6,749,013 discloses a heat sink with a plate-shaped heat pipe. The plate-shaped heat pipe has an upper plate member and a lower plate member that from a hermetically sealed cavity enclosing a working fluid. At least one fin is integrally formed with the upper plate member on its outer surface. At least one support column and at least one heat transferring metal column are located inside the cavity.

U.S. Pat. No. 6,082,443 discloses a cooling device including a plate-like container made of heat transferring metal for containing a working fluid. The plate-like container has a heat absorbing wall having protrusion portions abutting the bodies to be cooled.

U.S. Pat. No. 6,263,959 discloses a plate type heat pipe with two plate members facing each other to form a hermetically sealed container with a working fluid. At least one heat generating part is mounted on either plate. At least one heat transfer blocks having a cross-sectional area equal to or larger than a cross-sectional area of the heat generating part is located inside the container opposite the heat generating part.

U.S. Pat. No. 6,317,322 discloses a plate type heat pipe having a hermetically sealed container wherein a block passes through an opening in at least one main surface of the container and contacts a part to be cooled.

U.S. Pat. No. 5,694,295 discloses a heat pipe with a hollow container having a flat heating portion, a flat radiating portion opposite the heating portion and having a larger area than the heating portion, and a tapered wall portions joining the heating portion and the radiating portion. Flat heat pipes fabricated with copper plates with a wick structure of sintered copper powder on the interior walls are available from Thermacore, Inc. of Pennsylvania, Fujikura of Japan, and Chaun Choung Technology Corporation of Taiwan.

Plasma welding process was introduced to the welding industry in 1964 as a method of bringing better control to the arc welding process in lower current ranges. Plasma is a highly heated gas that is ionized so that it becomes electrically conductive. The plasma arc welding process uses plasma to transfer an electric arc to a work piece. The work pieces to be welded are melted by the intense heat of the arc and fuses together.

U.S. Pat. No. 5,813,592 discloses a method of friction stir welding for joining members. Friction stir welding is a solid state welding method that uses a probe with a rotational cylindrical body having an upper part connected to a power source and a bottom part with a pin. By inserting the probe between two members to be joined and applying pressure and rotation, a weld is provided by frictional heating during a transitional movement along the members.

U.S. Pat. No. 6,301,109 discloses an isothermal heat sink member with channels for carrying a coolant fluid. The channels are divided into a first group and a second group along different direction across the heat sink member. Cross-flow openings are provided between some adjacent channels so that the coolant can flow between the first and the second groups of channels.

Heat sinks with vapor chambers and flat heat pipes have been used for cooling computer and electronic systems. However, it is rarely used in low end applications because the market has not accepted the cost to performance ratio. Thus, what is needed is a low cost but highly efficient heat sink with a flat heat pipe.

BRIEF DESCRIPTION OF THE DRAWINGS

Use of the same reference numbers in different figures indicates similar or identical elements.

SUMMARY

In one embodiment of the invention, a flat heat pipe includes a spacer frame sandwiched between a top substrate and a bottom substrate. The spacer frame has an opening with a supporting peninsula extended from the edge. The opening defines a vessel space between the top and the bottom substrates. As a spacer, the supporting peninsula strengthens the mechanical stiffness of the flat heat pipe. The supporting peninsula also provides a heat conduction path from a heat source mounted to the bottom substrate below the supporting peninsula. Various capillary structures can be utilized to build the flat heat pipe. One cost-effective solution is a capillary structure consisting of grooves formed by a cold rolling process. A flat vapor chamber, which does not have interior capillary structure, can be built in same manner.

In another embodiment of the invention, a panelized welding process is used to make multiple flat heat pipes or flat vapor chambers in parallel with friction stir welding (FSW) or plasma beam welding technologies. The panelized welding process starts by sandwiching a spacer panel between a top panel and a bottom panel. The spacer panel defines multiple openings and supporting peninsulas that will define the vessel spaces in the flat heat pipes or flat vapor chambers. If this process is used to make the flat heat pipes, the top and the bottom panels would have capillary structures on inner faces for transporting the working fluid against gravity. FSW may be applied with one or two passes to join the sandwiched panels by following traces on the top and/or bottom surfaces along the perimeters and the supporting peninsulas of the flat heat pipes or flat vapor chambers. The individual flat heat pipes or flat vapor chambers are then singulated from the welded panel.

In another embodiment of the invention, a nearly isothermal heat sink is built with a flat heat pipe connected to a series of flat vapor chambers using conduits to form a common vapor domain. In other words, the domains of vacuum vessels distributed over the entire heat sink are all connected by conduits to form a closed loop through an evaporator and several condensers. For example, the nearly isothermal heat sink includes a flat heat pipe to be mounted on a heat source, a first flat vapor chamber above the flat heat pipe, and a second flat vapor chamber above the first flat vapor chamber. The flat heat pipe and the two flat vapor chambers are connected by conduits to transport working fluid and vapor among them. The conduits may include capillary structures so that the working fluid can be transported against gravity at certain orientations of the nearly isothermal heat sink. Fins are located between the flat heat pipe and the first flat vapor chamber, and between the first and the second flat vapor chambers. The working fluid evaporates in the flat heat pipe and the working vapor carrying latent heat condenses in the flat vapor chambers back to liquid, and then the working fluid flows back to the flat heat pipe through the conduits to complete the two phase heat transfer cycle.

DETAILED DESCRIPTION

To provide highly efficient convection cooling, the surface temperature of a heat sink should be as high as possible and the surface area should be as large as possible. Thus, the best performing heat sink should be ideally isothermal so that it dissipates heat in the most efficient way under natural or forced convection. However, it is generally too expensive to manufacture isothermal heat sinks. Flat heat pipes, which are close to being isothermal, have been manufactured for years but are rarely used for low end applications because the market has not accepted their cost to performance ratio. The present invention provides ways to manufacture nearly isothermal heat sinks at a low cost.

Figure 1A:
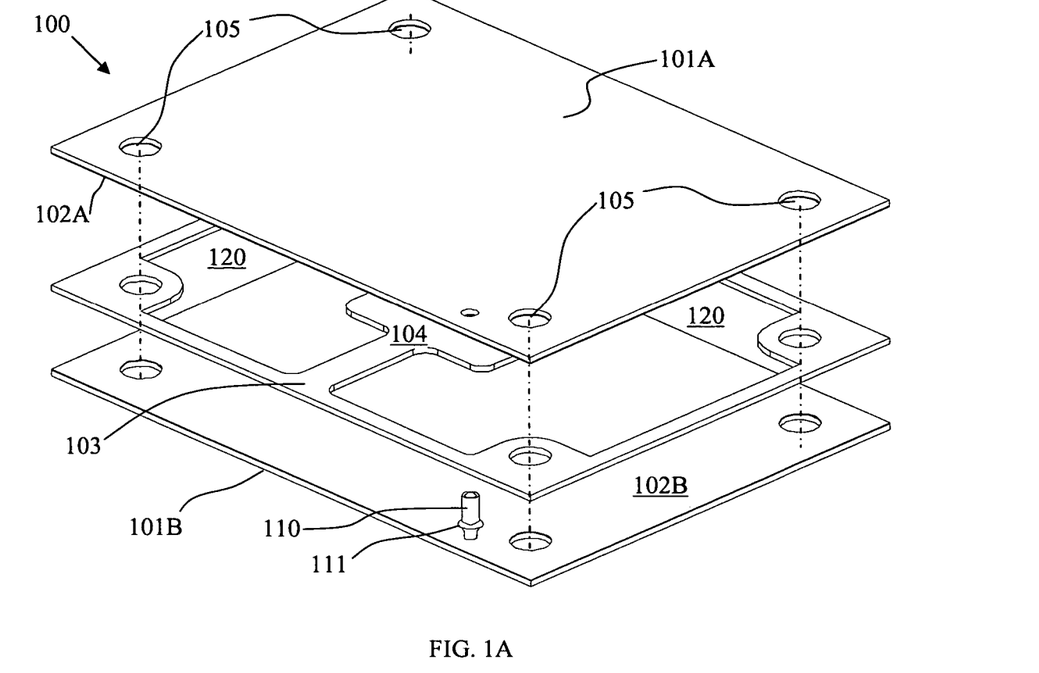
FIGS. 1A and 1B illustrate exploded and assembled views of a flat heat pipe or a flat vapor chamber for cooling a single heat source in one embodiment of the invention.
Figure 1B:
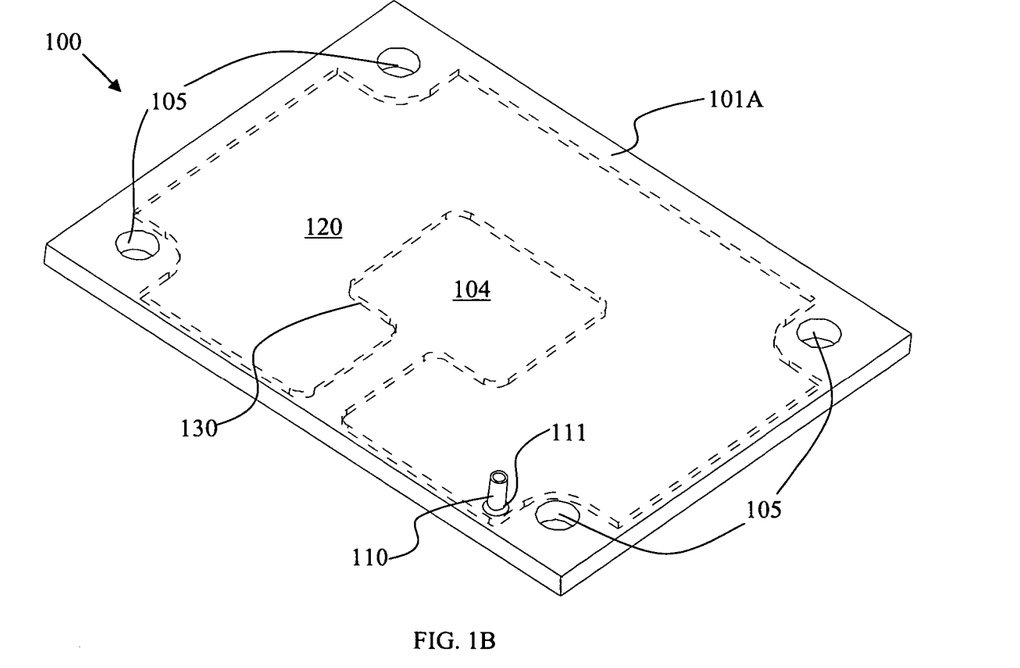

FIGS. 1A and 1B illustrate exploded and assembled views of a flat heat pipe 100 for cooling a single heat source in one embodiment of the invention. Flat heat pipe 100 includes a spacer frame 103 sandwiched between a top substrate 101A (e.g., a top rectangular plate) and a bottom substrate 101B (e.g., a bottom rectangular plate). A capillary layer 102A is attached on the inner surface of top substrate 101A and a capillary layer 102B is attached on the inner surface of the bottom substrate 101B. Alternatively, capillary layer 102A is formed on the inner surface of top substrate 101A and capillary layer 102B is formed on the inner surface of bottom substrate 101A.

Spacer frame 103 defines an opening 120 and has a supporting structure 104 (e.g., a supporting peninsula) extending from the edge of the frame into the center of opening 120. Opening 120 forms a vessel space illustrated with dashed lines 130 in FIG. 1B. Typically a heat source (e.g., an electronic device) is in contact with a pedestal on the bottom surface of bottom substrate 102B at the position below supporting peninsula 104. Supporting peninsula 104 serves several functions. Supporting peninsula 104 enhances the mechanical stiffness of flat heat pipe 100. Supporting peninsula 104 also provides a heat conductive path from the heat source to top substrate 101A, which maintains the advantage of a solid base for a heat sink. Metal punching may be the most cost-effective way to make spacer frame 103.

Mounting holes 105 are normally drilled through the sandwiched structure after it has been welded together. Mounting holes 105 are used to attach flat heat pipe 100 to a structure (e.g., a system board). A tube 110 is joined to top plate 101A by a weld joint 111. Tube 110 is used to evacuate the vessel space to form a vacuum and to fill the vessel space with the working fluid before tube 110 is sealed.

Flat heat pipe 100 works as follows. The working fluid evaporates from and condenses on the inner surfaces of top substrate 101A and bottom substrate 101B. Thus, both substrates play the roles of evaporator as well as condenser. Capillary structure 102A on the inner surface of top substrates 101A and capillary structure 102B on the inner surface of bottom substrate 101B pump the working fluid back toward supporting peninsula 104.

Figure 2A:
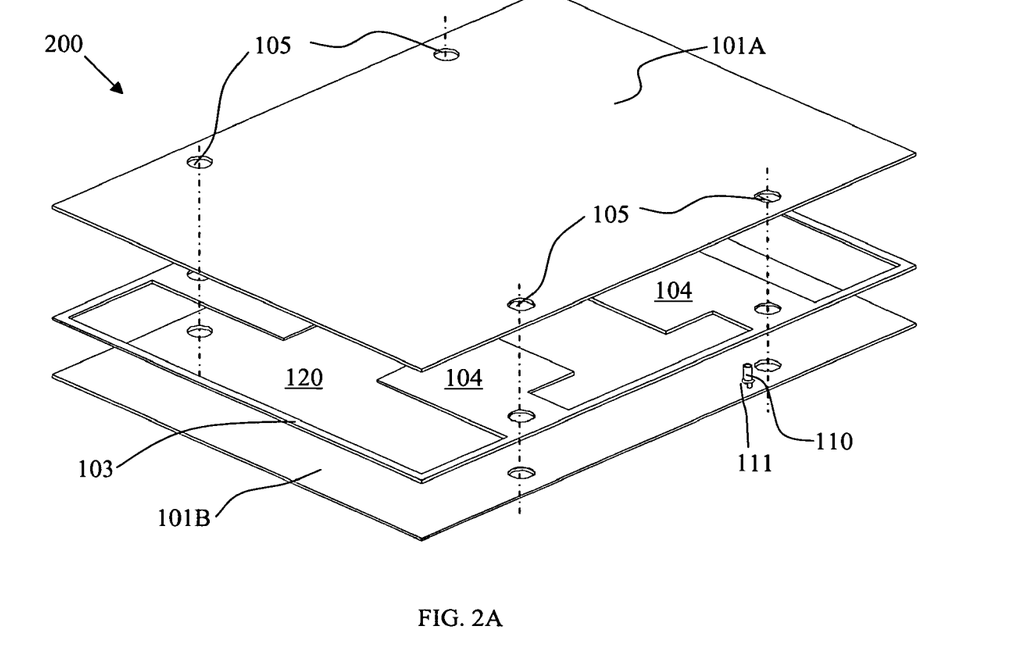
FIGS. 2A and 2B illustrate exploded and assembled views of a flat heat pipe or a flat vapor chamber for cooling multiple heat sources in one embodiment of the invention.
Figure 2B:
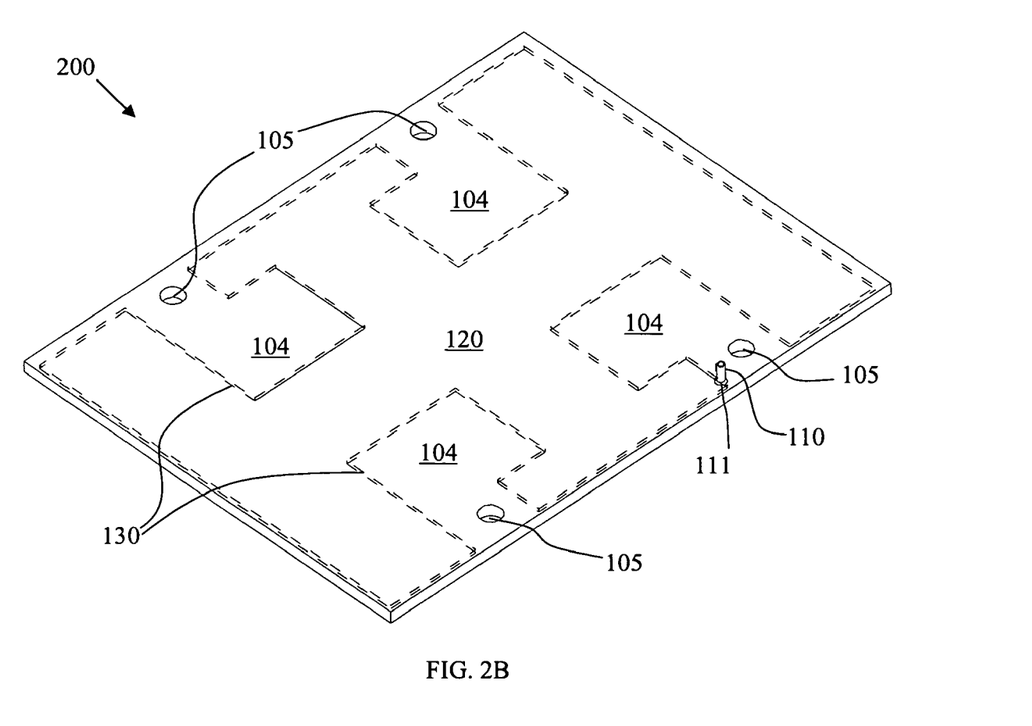

FIGS. 2A and 2B illustrate a flat heat pipe 200 for multiple heat sources in one embodiment of the invention. Flat heat pipe 200 is similar to flat heat pipe 100 but spacer frame 103 now has multiple supporting peninsulas 104 in opening 120. Typically multiple heat sources are in contact with pedestals on the bottom surface of bottom substrate 102B at the positions below supporting peninsulas 104.

In one embodiment, a flat vapor chamber is made in the same manner as flat heat pipes 100 and 200 except that the inner surfaces of top and bottom substrates do not have any capillary structure. A flat vapor chamber can only be used as a flat heat pipe when the flat vapor chamber is oriented horizontally. In contrast, a flat heat pipe works in any orientation because the capillary structure overcomes gravity and pumps the working fluid back to the evaporator portion of the flat heat pipe.

FIGS. 3A to 3D illustrate various capillary structures that can be used in flat heat pipes 100 and 200 in embodiments of the invention.

Figure 3A:
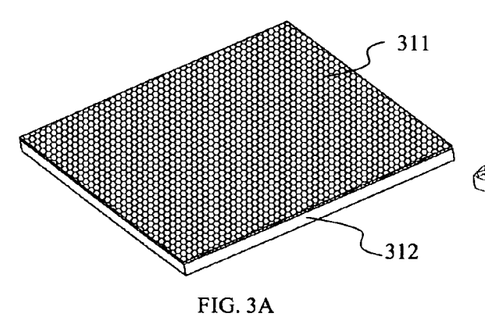
FIGS. 3A, 3B, 3C, and 3D illustrate plates with capillary structures used to form a flat heat pipe in embodiments of the invention.

FIG. 3A shows a substrate 312 with a capillary structure 311 consisting of metal powders or metal fibers that are sintered onto the substrate. In one embodiment, substrate 312 is copper sheet metal and capillary structure 311 is copper powder or copper fiber felt. This approach provides a very fine porous structure for high permeability at a high cost.

Figure 3B:
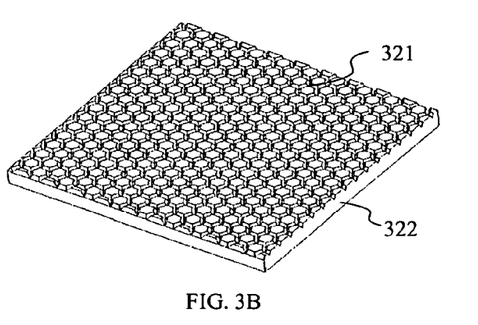

FIG. 3B shows a substrate 322 with a capillary structure consisting of V-grooves 321 arranged in hexagonal patterns. In one embodiment, plate 322 is copper sheet metal that has been hydro-pressed or stamped to form capillary structure 321.

Figure 3C:
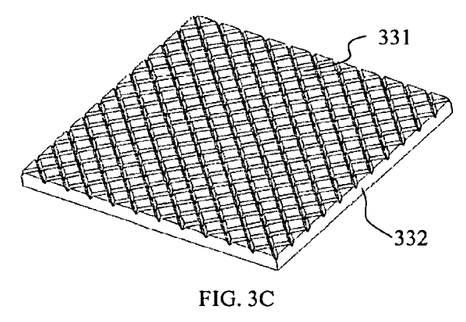

FIG. 3C shows a plate 332 with a capillary structure consisting of V-grooves 331 arranged in cross patterns. In one embodiment, plate 332 is copper sheet metal that has been hydro-pressed, stamped, or cold rolled to form capillary structure 331.

Figure 3D:
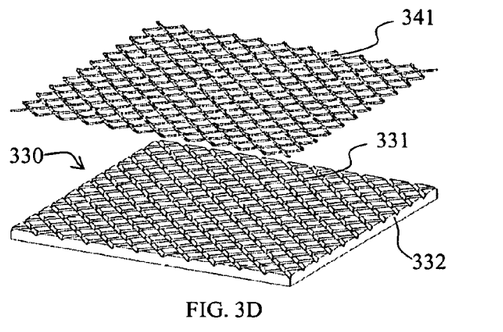

FIG. 3D shows a plate 332 with a capillary structure 330 consisting of V-grooves 331 and a metal mesh 341 fitted into the V-grooves. The metal mesh may be weaved with metal wires or etched from metal foils. In addition to providing fine capillary action, metal mesh 341 also separates the working vapor from the working fluid to improve performance. This approach is cost-effective and provides a fast way to make a flat heat pipe.

Figure 3E:
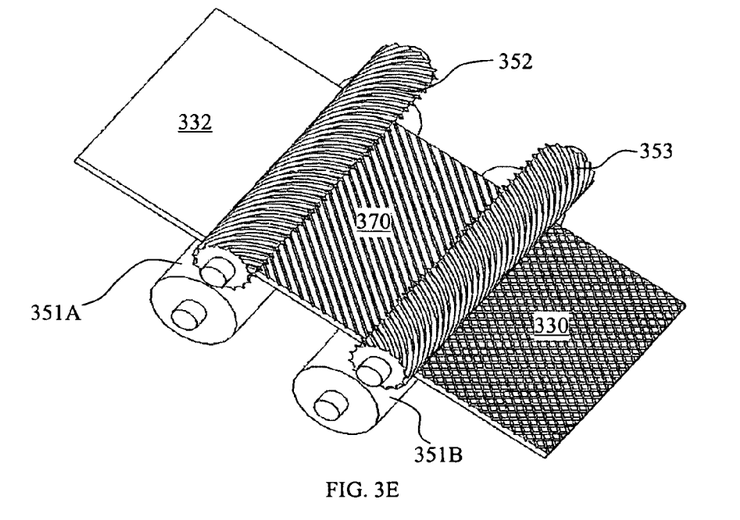
FIG. 3E illustrates a method to form grooves on a plate in one embodiment of the invention.

FIG. 3E illustrates a cold rolling process to form V-grooves 331 in one embodiment of the invention. Substrate 332 (a metal band, a metal plate, or a metal sheet) first passes between a right-handed multi-thread roller 352 and a supporting roller 351A to form parallel V-grooves 370 along a first direction. Substrate 332 then passes between a left-handed multi-thread roller 353 and a supporting roller 351B to form V-grooves 331 along two perpendicular directions. As shown above, V-grooves 331 are formed with one pass. Alternatively, V-grooves 331 are formed with two sequential passes in which two different rollers are separately used. These two approaches lower the cost substantially when compared with conventional machining.

Figure 4:
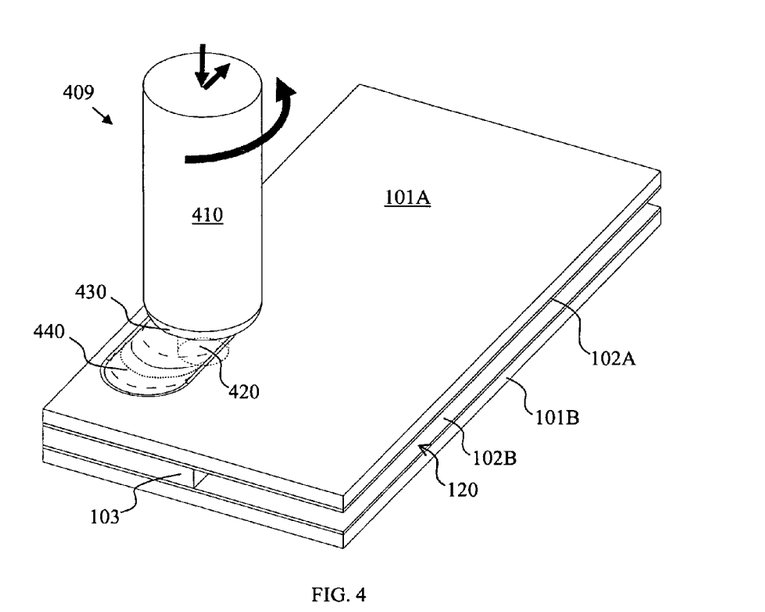
FIGS. 4, 5A, and 5B illustrate friction stir welding processes for welding a sandwiched structure into a flat heat pipe or a flat vapor chamber in one embodiment of the invention.

FIG. 4 illustrates a friction stir welding (FSW) process used to weld a flat heat pipe by joining top substrate 101A, spacer frame 103, and bottom substrate 101B along their overlapping portions in one embodiment of the invention. Top substrate 101A and bottom substrate 101B have capillary structures 102A and 102B on their respective inner surfaces facing space 120.

A representative FSW tool 409 has a cylindrical body 410 with a smaller diameter pin 420 at one end and a shoulder 430 formed between cylindrical body 410 and pin 420. In the FSW process, as tool 410 rotates and moves forward, pin 420 is plunged by a vertical compressing force into the overlapping portions of top substrate 101A, spacer plate 103, and bottom substrate 101B. Shoulder 430 is lowered into the top surface of top substrate 101A by the vertical compressing force and generates tremendous friction at the interface while tool 410 rotates and moves forward. As the heat from the friction causes the overlapping portions to reach their melting point locally, tool 410 can traverse the overlapping portions to weld the sandwiched structure along a welding trace. The FSW process leaves behind a welding surface 440, which can be polished for a smooth appearance.

If the welding trace is a closed loop, a hermetically sealed chamber or vessel is formed by the weld without using any consumables. It is noted that the strength of the FSW weld is very close to that of the base material. It is further noted that a flat vapor chamber can also be welded in the same manner if the top and bottom substrates do not have any capillary structure.

Figures 5A, 5B:
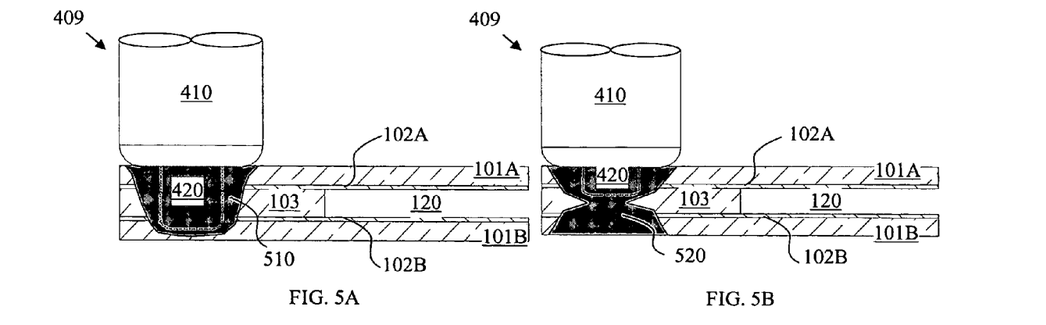

FIG. 5A illustrates a one-pass FSW process to join top substrate 101A, spacer frame 103, and bottom substrate 101B in one embodiment of the invention. As can be seen, pin 420 is long enough to penetrate top substrate 101A, spacer frame 103, and bottom substrate 101B to form a bond with an affected zone 510 between the three plates.

FIG. 5B illustrates a two-pass FSW process to join top substrate 101A, spacer frame 103, and bottom substrate 101B in one embodiment of the invention. In the first pass, tool 410 traverses along the exterior of top substrate 101A and pin 420 penetrates the interface between top substrate 101A and spacer frame 103. In the second pass, tool 410 traverses along the exterior of bottom substrate 101B and pin 420 penetrates the interface between spacer frame 103 and bottom substrate 101B. The sandwiched structure is bonded with the affected welding zone 520. The two-pass process may provide a stronger weld and can be used to form a thick structure.

Figure 6A:
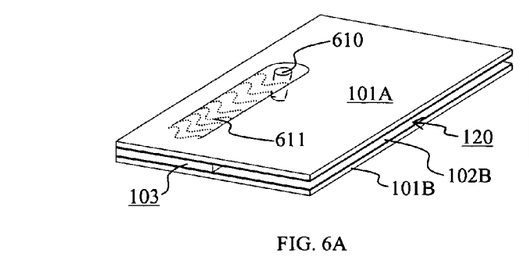
FIGS. 6A and 6B illustrate a plasma beam welding process for joining plates in a flat heat pipe or a flat vapor chamber in one embodiment of the invention.
Figure 6B:
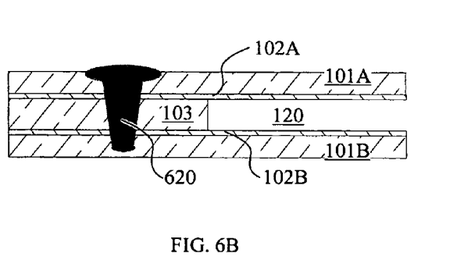

Although the FSW process has been specifically mentioned, other welding methods may be used to join the sandwiched structures described above. For example, FIGS. 6A and 6B illustrate a plasma welding process used to join top substrate 101A, spacer frame 103, and bottom substrate 101B in one embodiment of the invention. A plasma beam penetrates the sandwiched structure with a tilt angle. If the energy level is controlled properly, the plasma beam will not go through the sandwiched structure. As shown, the base material is turned over and forms welding trace 611 after re-solidification. After welding, a deep hole 610 remains and is known as the "keyhole." Thus, the plasma beam welding is recognized for the "keyhole effect." The shape of the affected zone 620 (FIG. 6B) provides the bonding for the sandwiched structure. Welding surface 611 can be polished for a smooth appearance.

If the welding trace is a closed loop, a hermetically sealed chamber or vessel is formed by the weld without using any consumables. It is noted that strength of the plasma welding process is very close to that of the base material. If the energy level is high enough for the plasma beam to penetrate through the sandwiched structure, the process becomes plasma beam cutting. Therefore, the process must be optimized for the sandwiched structure to ensure plasma beam welding instead of plasma beam cutting.

Figure 7:
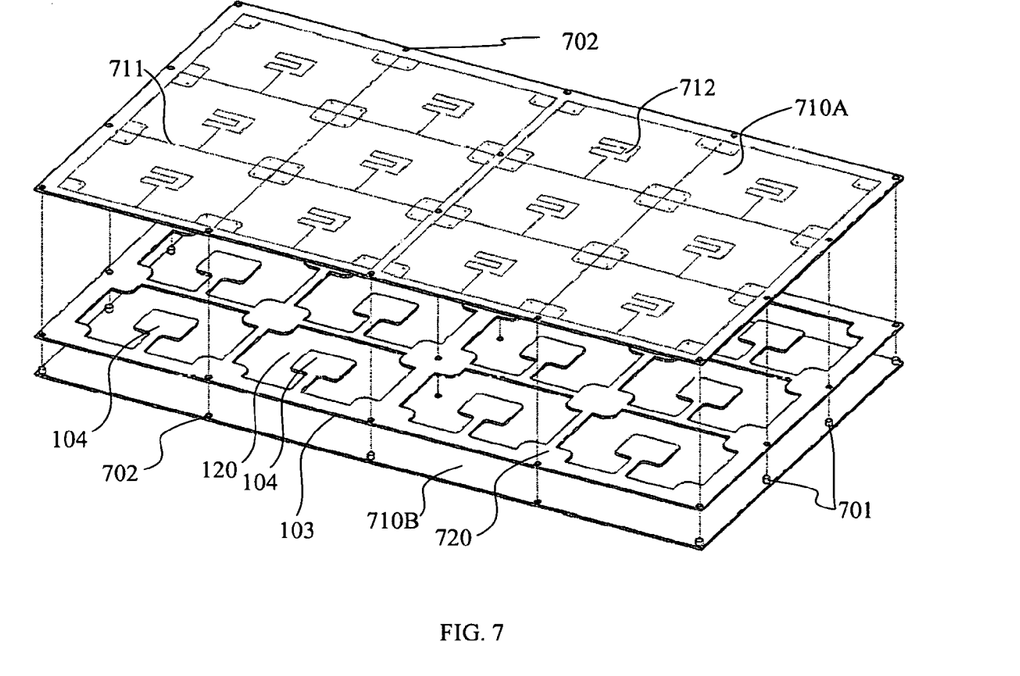
FIG. 7 illustrates a panelized welding process for manufacturing multiple flat heat pipes or flat vapor chambers in one embodiment of the invention.

Applying FSW or plasma beam welding techniques, flat heat pipes or flat vapor chambers can be welded very rapidly with a panelized welding process as illustrated in FIG. 7 in one embodiment of the invention. A top panel 710A and a bottom panel 710B are provided with or without capillary structures on their interior surfaces depending on if the process is used to form flat heat pipes or flat vapor chambers. A spacer panel 720 has multiple openings 120 (only one is labeled for clarity) that forms the vessel spaces in the individual spacer frames 103 (only one is labeled for clarity). Metal punching may be the most cost-effective way to make spacer panel 720.

Prior to the panelized welding, spacer panel 720 is sandwiched between top panel 710A and bottom panel 710B and the sandwiched panels are joined with spot welding at distributive locations 702 (only one is labeled for clarity) to prevent the panels from dislocating during welding. Some distributive holes 701 (only two are labeled for clarity) are used to mount the sandwiched panels on a work table. Imaginary joint lines 711 and 712 are illustrated on the exterior of top panel 710A. A computer numerical controlled (CNC) welding machine can be programmed to follow joint lines 711 and 712 to bond together top panel 710A, spacer panel 720, and bottom panel 710B. Joint lines 711 trace out the perimeters of the individual units and joint lines 712 trace out the supporting peninsulas 104 (only one is labeled for clarity) of the individual units.

After the three panels are welded together and the welding surface is ground for smoothness, ultrasonic scanning is used for non-destructive monitoring of the quality of the welds. If necessary, the defective welds can be repaired by re-welding the defective portions. The individual units of flat heat pipes or flat vapor chambers are then singulated by line cutting, punching, or other similar methods. After singulation, the interfaces on the four sides of each individual unit will disappear as shown in FIGS. 1B and 2B. If all three panels are of the same material, no signs of welding will be observed.

Figure 8:
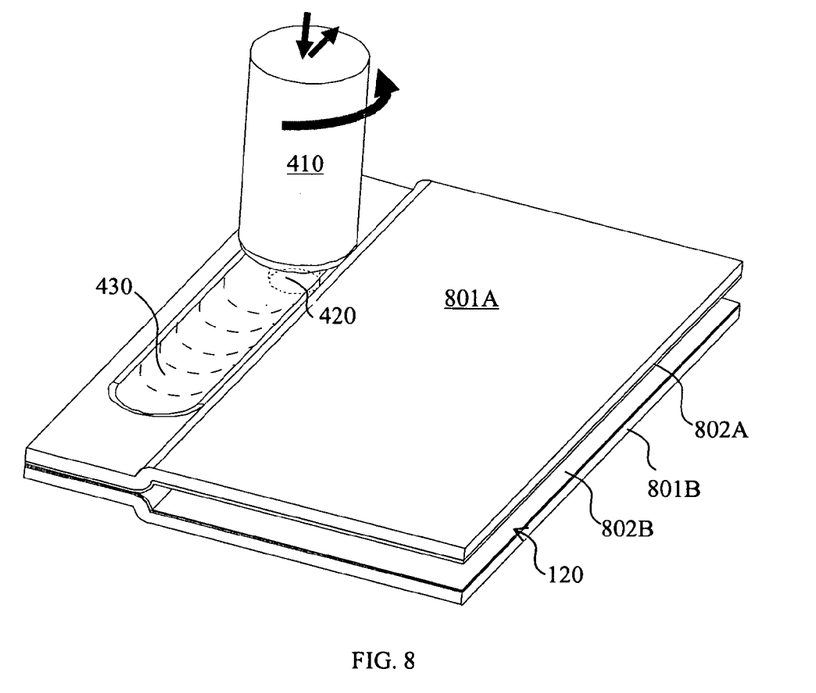
FIG. 8 illustrates a friction stir welding process for welding two plates into a flat heat pipe or a flat vapor chamber in one embodiment of the invention.

FIG. 8 illustrates a FSW process used to join a top substrate 801A and a bottom substrate 801B in another embodiment of the invention. In this embodiment, top substrate 801A and bottom substrate 801B have stepped flanges around their perimeters that create the vessel space between the two substrates. Top substrate 801A and bottom substrate 801B are joined at the stepped flanges by FSW. Top substrate 801A and bottom substrate 801B have capillary structures 802A and 802B on their respective inner surfaces if the resulting unit is a flat heat pipe. Alternatively, top substrate 801A and bottom substrate 801B do not have capillary structures 802A and 802B on their respective inner surfaces if the resulting unit is a flat vapor chamber.

Figure 9:
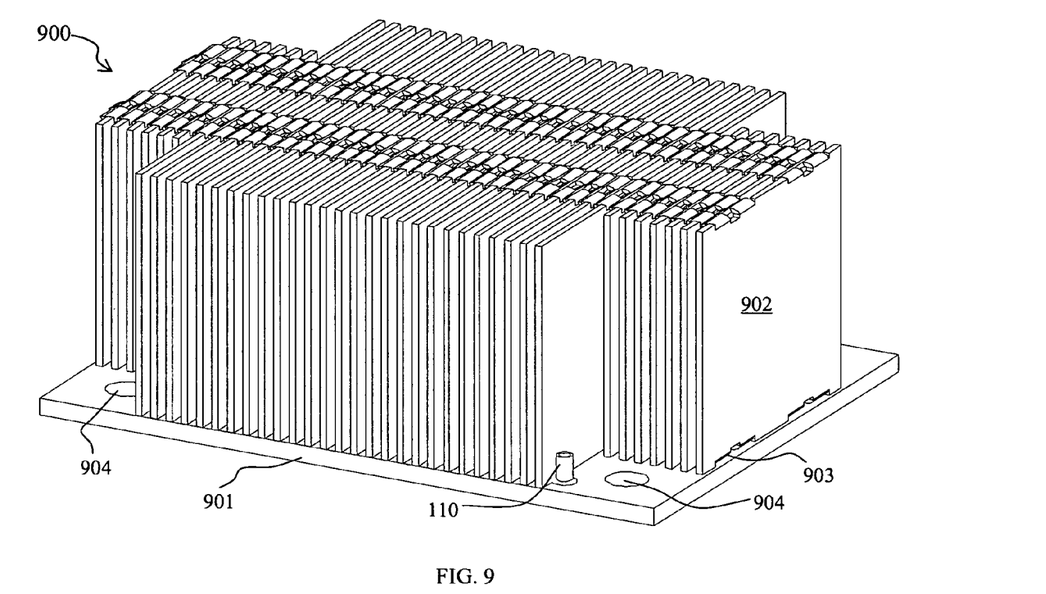
FIG. 9 illustrates a heat sink for a computer or electronic system in one embodiment of the invention.

FIG. 9 illustrates a heat sink 900 with a flat heat pipe 901 in one embodiment of the invention. Flat heat pipe 901 has a rectangular shape with fins 902 attached on its top surface. Fins 902 can be attached by soldering using an automated reflow process that screen prints solder paste 903 on the top surface of flat heat pipe 901. In a typical application, heat pipe heat sink 900 is mounted on top of an IC chip in any orientation because the capillary structure within flat heat pipe 901 can overcome gravity to pump the working fluid back to the evaporator zone in the flat heat pipe.

Individual fins 902 are clipped together before being attached on flat heat pipe 901. Flat heat pipe 901 has mounting holes 904 for attaching the heat sink to a system board. Flat heat pipe 901 also has a tube 110 for filling heat pipe 901 with the working fluid and sealing the chamber after the vacuum process. Generally, flat heat pipe 901 is made of copper and fins 902 are made of copper, aluminum, graphite, or highly thermally conductive polymers.

Though heat pipe heat sink 900 has a lower thermal resistance than a similarly sized heat sink with a solid base of the same thickness as flat heat pipe 901, it is still not very efficient if fins 902 are too long since the temperature on the top end of fins 901 will not be very high. The objective of the invention is to make a nearly isothermal heat sink by utilizing flat heat pipes and flat vapor chambers.

Figure 10:
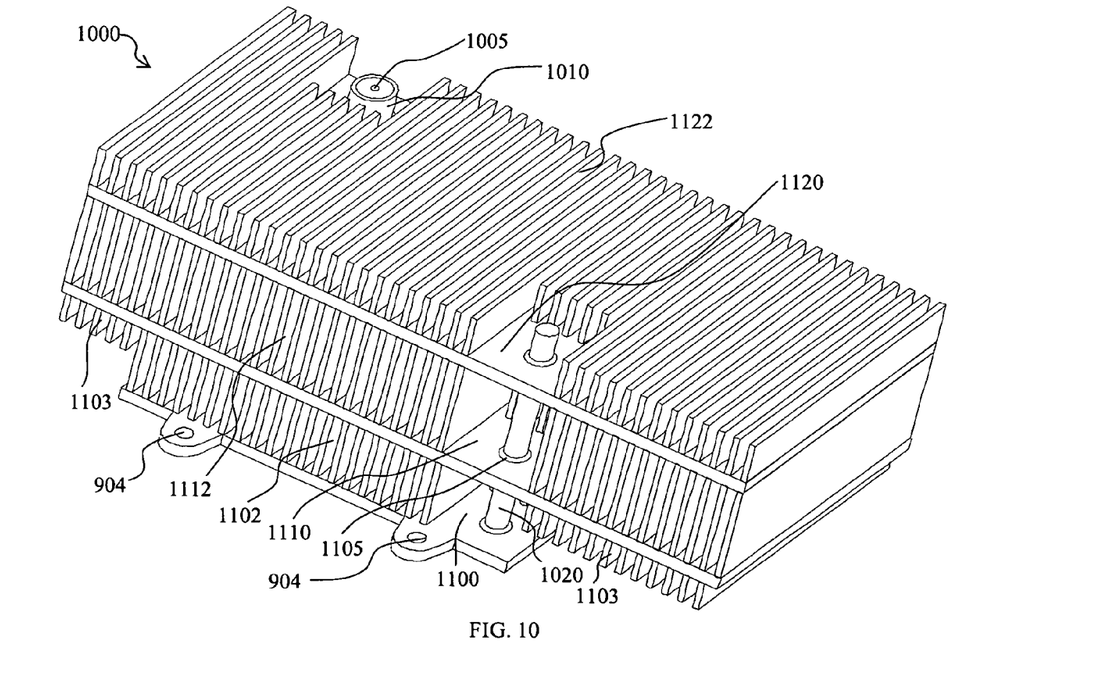
FIGS. 10, 11A, and 11B illustrate a layered isothermal heat sink in one embodiment of the invention.
Figure 11A:
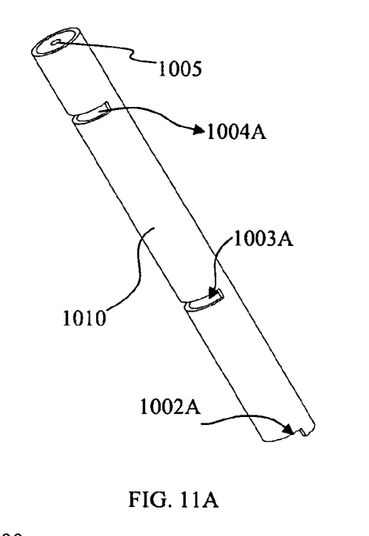

FIG. 10 illustrates a nearly isothermal heat sink 1000 in one embodiment of the invention. Heat sink 1000 includes a flat heat pipe 1100 used as an evaporator as well as a condenser, a first flat vapor chamber 1110 used as another condenser, and a second flat vapor chamber 1120 used as yet another condenser. A conduit 1010 (shown individually in FIG. 11A) is used as a channel for working vapor to flow from flat heat pipe 1100 to flat vapor chambers 1110 and 1120 and for working fluid to flow back to flat heat pipe 1100. Specifically, conduit 1010 is inserted through openings in flat heat pipe 1100, flat vapor chamber 1110, and flat vapor chamber 1120. Conduit 1010 has openings 1002A, 1003A, and 1004A that open to the vessel spaces in flat heat pipe 1100, flat vapor chamber 1110, and flat vapor chamber 1120, respectively. A seal or welding bead (not visible for conduit 1010) is formed around the conduit openings.

Figure 11B:
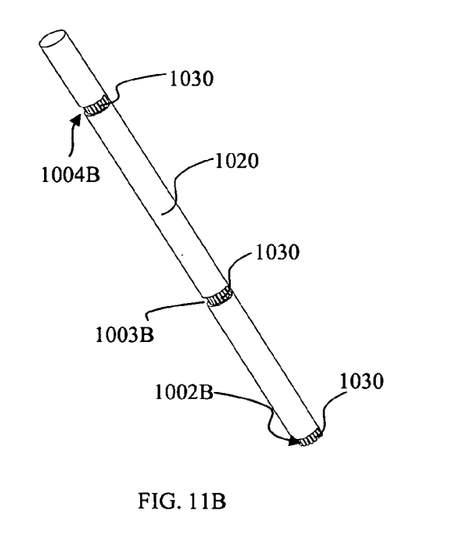

Working in conjunction with conduit 1010, a round heat pipe 1020 (shown individually in FIG. 11B) carries working liquid from flat vapor chambers 1110 and 1120 back to flat heat pipe 1100. Specifically, heat pipe 1020 is inserted through openings in flat heat pipe 1100, flat vapor chamber 1110, and flat vapor chamber 1120. Heat pipe 1020 has openings 1002B, 1003B, and 1004B that open to the vessel spaces in flat heat pipe 1100, flat vapor chamber 1110, and flat vapor chamber 1120 respectively. A seal or welding bead 1105 (only one is labeled for clarity) is formed around the conduit openings. Heat pipe 1020 has an inner surface with capillary structure 1030 or is filled with a material such as fibers or wires to form capillary structure 1030. Capillary structure 1030 returns the working fluid back to flat heat pipe 1100. When connected by conduit 1010 and heat pipe 1020, flat heat pipe 1100, flat vapor chamber 1110, and flat vapor chamber 1120 form a common vapor domain. Conduit 1010 (described above) has a hole 1005 used for evacuating the common vapor domain to form a vacuum and for filling the common vapor domain with the working fluid before hole 1005 is sealed.

Fins 1102 are attached (e.g., soldered) between the top surface of flat heat pipe 1100 and the bottom surface of flat vapor chamber 1110. Fins 1103 are mounted to the bottom surface of flat vapor chamber 1110 on either side of fins 1102. Flat heat pipe 1100 is smaller than flat vapor chambers 1110 and 1120, and fins 1103 are shorter than fins 1102. This accommodates for taller components that may be located on either side of a heat source contacting the bottom of flat heat pipe 1100. Fins 1112 are attached between the top surface of flat vapor chamber 1110 and the bottom surface of flat vapor chamber 1120. Fins 1122 are mounted on the top surface of flat vapor chamber 1120. Mounting holes 904 are normally drilled through flat heat pipe 1100 after it has been welded together. Mounting holes 904 are used to attach heat sink 1000 to a structure (e.g., a system board).

Heat sink 1000 is nearly isothermal because each of flat heat pipe 1100, flat vapor chamber 1110, and flat vapor chamber 1120 is a nearly isothermal device and they are all kept at nearly the same temperature by their interconnection through conduits 1010 and 1120. As flat heat pipe 1100, flat vapor chamber 1110, and flat vapor chamber 112 are kept at nearly the same temperature, fins 1102 and 1112 is equally isothermal. Fins 1103 and 1122 are also kept nearly isothermal because of their short lengths. Thus, fins 1103, 1122, 1102, and 1112 provide large isothermal surfaces that greatly improve the efficiency of heat dissipation.

When heat sink 1000 sits vertically (as illustrated in FIG. 10), the condensed working fluid in flat vapor chambers 1110 and 1120 flows down through conduit 1010 and heat pipe 1020 back to flat heat pipe 1100 by the force of gravity.

Figure 12:
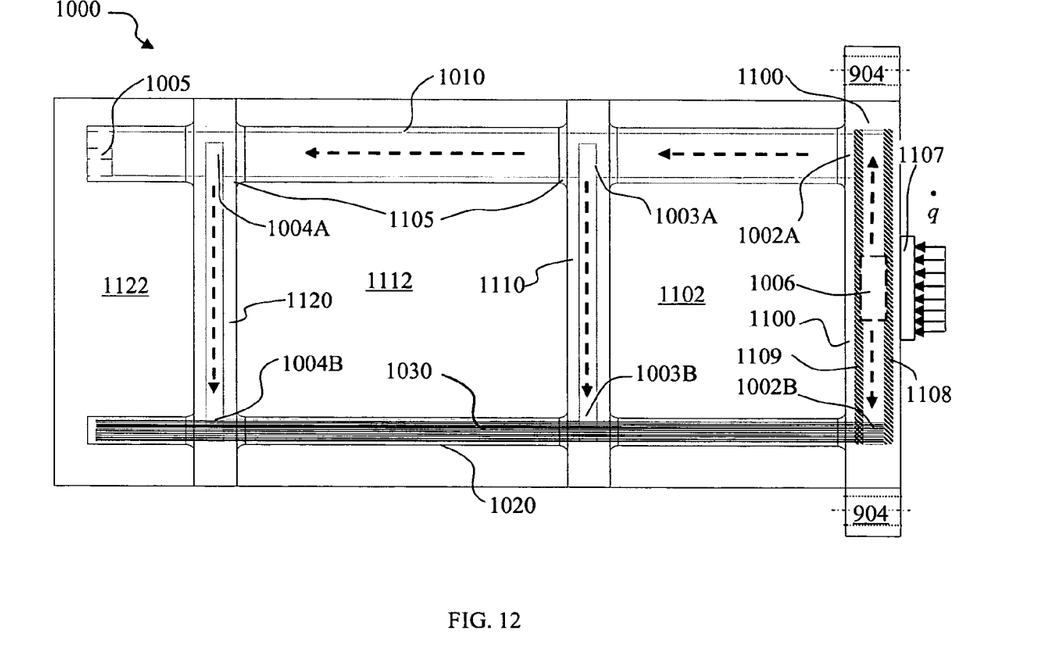
FIG. 12 illustrates the heat sink of FIG. 10 operating in a horizontal manner in one embodiment of the invention.

Often heat sink 1000 is mounted to a system board that is mounted vertically in a rack or a chassis. In this situation, heat sink 1000 sits horizontally. FIG. 12 illustrates the operation of heat sink 1000 when it sits horizontally in one embodiment of the invention.

As can be seen, flat heat pipe 1100 and flat vapor chambers 1110 and 1120 are now oriented vertically. Flat heat pipe 1100 includes a pedestal 1107 that contacts the heat source to absorb heat. Opposite of pedestal 1107 on the other side of the bottom substrate of flat heat pipe 1100 is a supporting peninsula 1006. Supporting peninsula 1006 conducts heat from pedestal 1107 to capillary structures 1108 and 1109 to evaporate the working fluid. The evaporated working fluid travels through conduit 1010 to fill flat vapor chambers 1110 and 1120.

The latent heat carried by the vapor is dissipated through fins 1102, 1112, and 1122 under natural or forced convection so that the working vapor quick condenses to liquid. Capillary structure 1030 in heat pipe 1020 then pumps the working fluid back to flat heat pipe 1100. In one embodiment, heat pipe 1020 is filled with a material with capillary structure 1030. As the working fluid fills capillary structure 1030, the high vapor pressure in flat vapor chambers 1110 and 1120 pushes the working liquid back to flat heat pipe 1100. Thus, both vapor pressure and capillary action drive the working fluid back to flat heat pipe 1100. Once the working fluid reaches flat heat pipe 1100, it is evaporated again from capillary structures 1108 and 1109.

Although heat sink 1000 works upside-down, it is not recommended because it may not be as efficient as the two previously described orientations.

Figure 13:
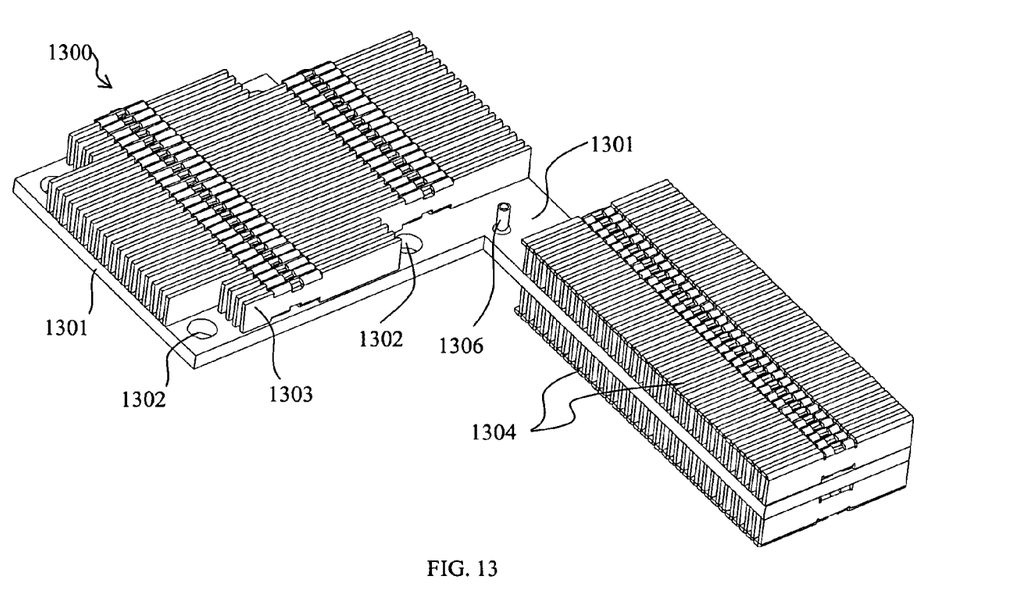
FIG. 13 illustrates a heat sink using an L-shaped flat heat pipe for portable computers in one embodiment of the invention.

FIG. 13 illustrates a heat sink 1300 with a flat heat pipe 1301 for a portable computer (e.g., a laptop or a tablet PC) in one embodiment of the invention. Flat heat pipe 1301 has an L-shape where a first portion having fins 1303 is mounted on top of a heat source and a second portion having fins 1304 is located away from the heat source. In one embodiment, the second portion is located near a vent in the computer case so that a fan can move cold air from the outside over fins 1304.

Individual fins are clipped together before being attached (e.g., soldered) onto flat heat pipe 1301. Fins 1304 are attached above and below flat heat pipe 1301. Flat heat pipe 1301 has mounting holes 1302 for attaching the heat pipe to a system board. Flat heat pipe 1301 also has a tube 1306 for filling heat pipe 1301 with the working fluid and creating a vacuum within heat pipe 1301.

Figure 14:
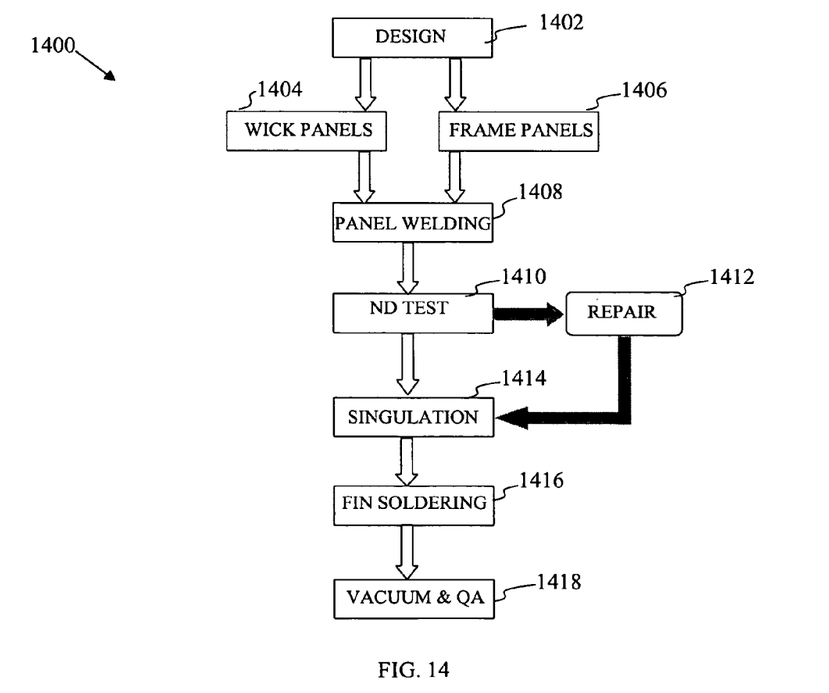
FIG. 14 illustrates a flowchart for manufacturing a flat heat pipe or a flat vapor chamber in one embodiment of the invention.

FIG. 14 illustrates a flowchart of a manufacturing process 1400 for a heat sink in one embodiment of the invention. In step 1402, the heat sink is designed. For example, the shape and the dimensions of the heat sink are determined. Step 1402 is followed by steps 1404 and 1406.

In step 1404, two panels with capillary structures for making the top substrates and the bottom substrates of the flat heat pipes are made. In step 1406, a panel for making the spacer frames of the flat heat pipes is made. Steps 1404 and 1406 are followed by step 1408.

In step 1408, the three panels are joined by welding. Step 1408 is followed by step 1410.

In step 1410, nondestructive testing is performed to assess the welds between the three panels. If the welds do not pass the test, step 1410 is followed by step 1412 where the welds are repaired and then step 1412 is followed by step 1414. If the welds do pass the test, step 1410 is followed by step 1414.

In step 1414, the individual flat heat pipes are singulated from the welded panels. Step 1414 is followed by step 1416.

In step 1416, fins are attached on the individual flat heat pipes. Step 1416 is followed by step 1418.

In step 1418, the individual flat heat pipes are filled with the working fluid and then vacuumed. The individual flat heat pipes are then tested to assure quality.

Process 1400 described above can be used to make flat vapor chambers if the top and bottom panels do not have any capillary structures on their inner surfaces.

Various other adaptations and combinations of features of the embodiments disclosed are within the scope of the invention. Numerous embodiments are encompassed by the following claims.

What is claimed is:

1. A nearly isothermal heat pipe heat sink, comprising:
   a flat heat pipe comprising openings;
   at least one flat vapor chamber comprising through holes;
   a conduit and an interconnecting heat pipe coupling the flat heat pipe and the flat vapor chamber to provide a common vapor domain, the common vapor domain being under vacuum, the conduit and the interconnecting heat pipe being inserted through respective through holes in the flat vapor chamber and into respective openings in the flat heat pipe, the conduit and the interconnecting heat pipe having respective lateral openings that open into the flat vapor chamber and respective open ends that open into the flat heat pipe;
   a working fluid in the common vapor domain; and
   a plurality of fins contacting opposing surfaces of the flat heat pipe and the flat vapor chamber.

2. The heat sink of claim 1, wherein the flat heat pipe comprises:
   a spacer frame defining an opening and including at least one supporting peninsula structure in the opening, the supporting peninsula structure being connected by an isthmus structure to an inner edge of the spacer frame, the supporting peninsula structure being located above a heat source on the other side of a bottom substrate to provide a heat conduction path; and
   a top substrate and the bottom substrate sandwiching the spacer frame to form a vessel, wherein the top and the bottom substrates have capillary structures.

3. The heat sink of claim 2, wherein the flat heat pipe comprises a pedestal on a bottom surface of the bottom substrate, the pedestal being located below the supporting peninsula structure on the other side of the bottom substrate and above the heat source.

4. The heat sink of claim 2, further comprising a weld joint on at least one of a top surface of the top substrate and a bottom surface of the bottom substrate, the weld joint joining the spacer frame including the supporting peninsula structure to the top and the bottom substrates.

5. The heat sink of claim 1, wherein the flat vapor chamber comprises:
   a spacer frame defining an opening; and
   a top substrate and a bottom substrate sandwiching the spacer frame to form a vessel.

6. The heat sink of claim 1, further comprising:
   another flat vapor chamber, wherein the conduit and the interconnecting heat pipe further couple the flat heat pipe, the flat vapor chamber, and the another flat vapor chamber; and
   another plurality of fins between the flat vapor chamber and the another flat vapor chamber.

7. The heat sink of claim 6, wherein the plurality of fins is orthogonal to the opposing surfaces of the flat heat pipe and the flat vapor chamber, and the another plurality of fins is orthogonal to the opposing surfaces of the flat vapor chamber and the another flat vapor chamber.

8. The heat sink of claim 1, wherein at least one of the flat heat pipe and the flat vapor chamber comprises:
   a top substrate comprises a first S-shape stepped flange; and
   a bottom substrate comprises a second S-shape stepped flange in a mirrored configuration and joined with the first S-shape stepped flange.

9. The heat sink of claim 1, further comprising solder joints attaching the fins to the opposing surfaces of the flat heat pipe and the flat vapor chamber.

10. The heat sink of claim 1, wherein the fins are orthogonal to the opposing surfaces of the flat heat pipe and the flat vapor chamber.

* * * * *